United States Patent [19]
Klinger et al.

[11] Patent Number: 5,313,701
[45] Date of Patent: May 24, 1994

[54] ASSEMBLY AND TESTING OF ELECTRONIC POWER COMPONENTS INSULATION

[75] Inventors: Herbert Klinger, Nuremberg; Gerhard Thomas, Fuerth; Martin Petrzik, Nuremberg, all of Fed. Rep. of Germany

[73] Assignee: Robert Bosch GmbH, Stuttgart, Fed. Rep. of Germany

[21] Appl. No.: 916,863

[22] PCT Filed: Mar. 23, 1991

[86] PCT No.: PCT/DE91/00263
§ 371 Date: Jul. 30, 1992
§ 102(e) Date: Jul. 30, 1992

[87] PCT Pub. No.: WO91/16809
PCT Pub. Date: Oct. 31, 1991

[30] Foreign Application Priority Data
Apr. 14, 1990 [DE] Fed. Rep. of Germany ....... 4012180

[51] Int. Cl.[5] .............................................. H05K 3/34
[52] U.S. Cl. .......................................... 29/840; 29/832; 174/138 G; 324/537; 324/555; 361/709
[58] Field of Search ................ 324/537, 555, 557; 361/386, 387; 29/832, 840; 174/138 G

[56] References Cited

U.S. PATENT DOCUMENTS

| | | | |
|---|---|---|---|
| 4,495,515 | 1/1985 | Pamiello | 174/138 G X |
| 4,498,120 | 2/1985 | Kaufman . | |
| 4,602,125 | 7/1986 | West et al. | 361/387 X |
| 4,648,008 | 3/1987 | Neyroud et al. . | |
| 4,669,028 | 5/1987 | Faa, Jr. . | |
| 4,724,514 | 2/1988 | Kaufman . | |
| 4,756,081 | 7/1988 | Penn | 361/387 X |
| 4,965,699 | 10/1990 | Jorden et al. | 361/387 |
| 4,979,074 | 12/1990 | Morley et al. | 361/387 X |
| 5,068,708 | 11/1991 | Newman . | |

FOREIGN PATENT DOCUMENTS

| | | |
|---|---|---|
| 2722142 | 6/1979 | Fed. Rep. of Germany . |
| 053152252 | 8/1984 | Fed. Rep. of Germany . |
| 3331207 | 3/1985 | Fed. Rep. of Germany . |
| 3412296 | 11/1985 | Fed. Rep. of Germany . |
| 3828853 | 3/1990 | Fed. Rep. of Germany . |

*Primary Examiner*—Carl J. Arbes
*Attorney, Agent, or Firm*—Michael J. Striker

[57] ABSTRACT

In accordance with a method for assembly and testing the insulation of power components for electronic switching and control devices, particularly for motor vehicles, the power components are fastened to a heat sink so as to be thermally conducting and electrically insulated and are connected together with additional component elements on a printed circuit board and with a circuit ground. In order to protect voltage-sensitive component elements on the printed circuit board, the heat sink is first fastened to the printed circuit board without potential and then the insulation between the heat sink and power component is tested by applying high voltage between the heat sink and power component, and the heat sink is finally electrically connected with the circuit ground.

4 Claims, 1 Drawing Sheet

5,313,701

ASSEMBLY AND TESTING OF ELECTRONIC POWER COMPONENTS INSULATION

BACKGROUND OF THE INVENTION

The present invention relates to a method for assembly and testing the insulation of electronic power components in electrical switching and control devices.

More particularly, it relates to a method for assembly and testing the insulation of such control devices, particularly for motor vehicles which are fastened to a heat sink so as to be thermally conducting and electrically insulating, which heat sink fits securely on a printed circuit board on which the power components and additional electrical component elements are connected via conductor path by soldering together with connection parts and a circuit ground.

It is already known from DE-OS 33 31 207 to fasten the electronic power components at a heat sink via a thermally conducting insulating foil by means of a plastic fastening part and to perform electrical testing of the component group preassembled in this way. High voltage is applied for testing the insulation between the heat sink and power components. The preassembled component group is then fastened on the printed circuit board and the connection pins of the power components must be inserted into the holes of the printed circuit board assigned to them in a costly and cumbersome manner. The power components are then connected with additional electronic component elements on the printed circuit board by soldering. In such switching and control devices for motor vehicles the component elements on the printed circuit board generally form a logic and the power components form the end stages in the form of power transistors.

The aforementioned method for assembly and testing the insulation between the heat sink and power components is supposed to ensure that sensitive component parts, e.g. computers, on the printed circuit board are not destroyed by high voltage. However, the known solution has the disadvantage that the insertion of the preassembled heat sink and power component group into the printed circuit board poses considerable problems, particularly with bent connection pins, so that mechanical assembly is not possible.

SUMMARY OF THE INVENTION

Accordingly, it is an object of the present invention to provide a method for assembly and testing the insulation of electrical power components of heat sinks which avoids the disadvantages of the prior art.

In keeping with these objects and with others which will become apparent hereinafter, one feature of the present invention resides, briefly stated, in a method in accordance with which the heat sink is first fastened to a printed circuit board so as to be free of potential, the power components are now inserted into the printed circuit board so as to be thermally conducting and electrically insulated at the heat sink, and the connection pins of the power components are soldered with the conductor paths of the printed board, the insulation between the potential-free heat sink and the power components is then tested by applying high voltage, and the heat sink is finally electrically connected with the circuit ground.

The process according to the invention for assembly and testing the insulation of the electronic switching and control device has the advantage that the heat sink is free of potential when testing the insulation so that the high voltage applied between it and the power components connected with the printed circuit board can not act on the rest of the voltage-sensitive components on the printed circuit board. A further advantage consists in that the power components can now be inserted into the corresponding holes of the printed circuit board individually and therefore with substantially fewer problems and therefore also mechanically.

All components and component parts can now be easily inserted into the printed circuit board individually and directly from above with the aid of insertion means, protuberances and fixing pins, and defective component elements can be easily removed and exchanged. The insertion means provide a simple, inexpensive and quick assembly since only the connection pins of the component parts need be joined. In the case of bent connection pins a simple correction can be effected manually. This results in more reliable manufacturing while simultaneously economizing on time and expense.

Since the heat sink is electrically connected with the circuit ground only after the high-voltage testing, the power components can be tested with high voltage without electrically loading the rest of the component parts on the printed circuit board. After the insulation is tested, a conductor path of the printed circuit board which is connected with the ground connection as so-called circuit ground is connected with the heat sink so as to be electrically conductive and accordingly also with the housing or front panel via at least one additional rivet in a very simple manner. A particularly advantageous assembly aid for the insertion of the power components in the printed circuit board can be achieved in that the power components are inserted individually in a plastic frame attached to the heat sink and printed circuit board and their connection pins are threaded into the associated holes of the printed circuit board through flared holes of the plastic frame itself.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 2 shows a front view of the preassembled component group with the additional ground connection of the

DESCRIPTION OF THE PREFERRED EMBODIMENT

Figure 1:
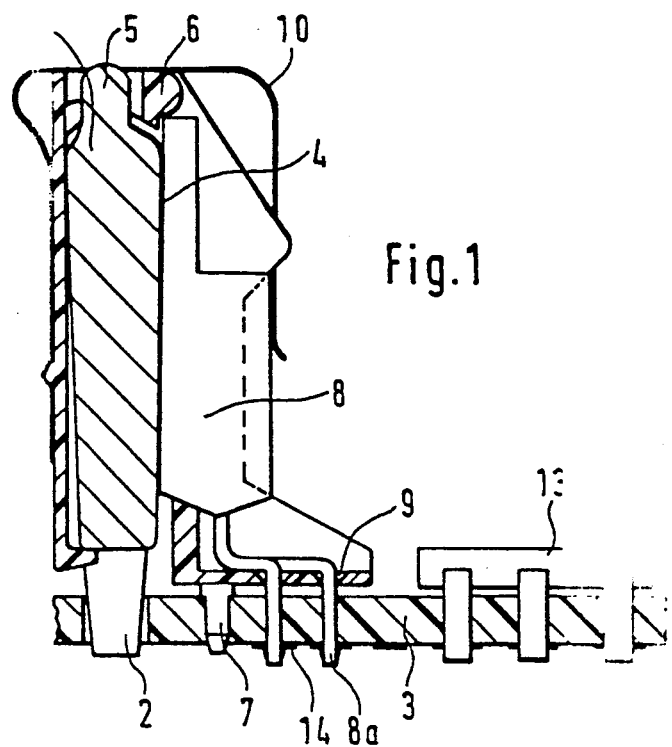
FIG. 1 shows a preassembled component group for a switching and control device having a cooling plate, power component and printed circuit board prior to the testing of the insulation in an enlarged cross-sectional view.

To produce a switching and control device for motor vehicles a heat sink 1 of cast aluminum with guide pins 2 is first placed on a printed circuit board 3 which has already been outfitted with additional component elements 13, particularly logic units. The heat sink 1 is fastened at fastening bore holes of the printed circuit board 3 by rivets 11. The printed circuit board 3 has no conductor paths in these areas. A thermally conductive insulating foil 4 is then placed on a guide projection 5 of the heat sink 1 and glued with the front side of the heat sink 1. A plastic frame 6 is now placed on the heat sink 1 and fixed in the printed circuit board 3 by guide pins 7. The electronic power components 8 are then inserted into the plastic frame 6 and their connection pins 8a are threaded into the holes of the printed circuit board 3 assigned to them through flared holes 9 in the base of the plastic frame 6. A clamping spring 10 is then placed on each of the electronic power components 8 and the heat sink 1 so that they contact one another along their surface area via the insulating foil 4. The connections of the electronic component elements 8 and 13 and the connection parts 15 of the switching and control device are now connected via the conductor paths 14 lying on the underside of the printed circuit board 3 by soldering.

Figure 2:
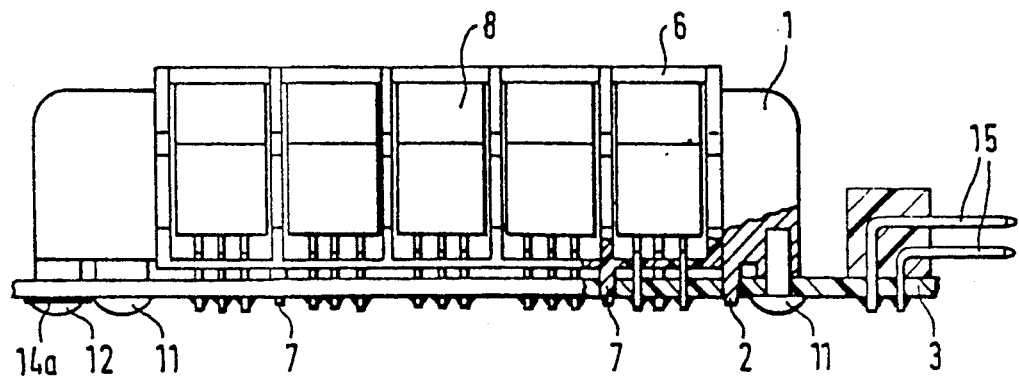

The component group which is preassembled in this way is now connected to high voltage to test the insulation between the heat sink 1 and the power component elements 8. The high voltage is connected on one side to the heat sink 1 which is still free of potential and on the other side to the different connection pins 8a of the power components 8. The potential-free fastening of the heat sink 1 to the printed circuit board 3 ensures that the applied high voltage does not damage the voltage-sensitive component elements 13, e.g. microprocessors or logic modules and the like. After this test, the heat sink 1 is finally fastened to the printed circuit board 3 by an additional rivet 12 in the area of a conductor path 14a of the printed circuit board 3. The conductor path 14a is connected as circuit ground with a ground connection of the connection parts 15, and the circuit ground is connected with the heat sink 1 so as to be electrically conductive. Of course, additional rivets 12 which connect the conductor paths 14a with the heat sink 1 at additional locations can also be provided. Finally, the component group which is preassembled according to FIG. 2 is inserted into a housing of the switching and control device, not shown, and this housing is connected with a cover comprehending the connection parts 15.

It will be understood that each of the elements described above, or two or more together, may also find a useful application in other types of methods differing from the types described above.

While the invention has been illustrated and described as embodied in a method for assembly and testing the insulation of electronic power components of heat sinks, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method for assembly and testing the insulation of electronic power components in electrical switching and control devices, particularly for motor vehicles, which are fastened to a heat sink so as to be thermally conducting and electrically insulated, which heat sink fits securely on a printed circuit board on which the power components and additional electrical elements are connected via conductor paths by soldering together with connecting parts and a circuit ground, the method comprising the steps of first fastening the heat sink to the printed circuit board so as to be free of potential; inserting the power components into the printed circuit board so as to be thermally conducting and electrically insulated at the heat sink; soldering connection pins of the power components with the conductor paths of the printed circuit board; testing the insulation between the potential-free heat sink and the power components by applying high voltage; and finally electrically connecting the heat sink with the circuit ground.

2. A method as defined in claim 1; and further comprising the steps of connecting one of the conductor paths of the printed circuit board as a circuit ground with a ground connection; and connecting the one of the conductor paths with the heat sink so as to be electrically conducting via at least one rivet after the testing of the insulation of the power components.

3. A method as defined in claim 1; and further comprising the steps of inserting the power components individually in a plastic frame attached to the heat sink and the circuit board; and threading the power components by their connection pins into holes of the printed circuit board which are assigned to them through flared holes of the plastic frame.

4. A method as defined in claim 3; and further comprising the steps of attaching the plastic frame to the printed circuit board; and outfitting the printed circuit board on the plastic frame attached to it with the power components in a mechanical manner.

* * * * *